(12) United States Patent
Lin et al.

(10) Patent No.: US 10,121,043 B2
(45) Date of Patent: Nov. 6, 2018

(54) PRINTED CIRCUIT BOARD ASSEMBLY WITH IMAGE SENSOR MOUNTED THEREON

(71) Applicant: SunASIC Technologies, Inc., New Taipei (TW)

(72) Inventors: Chi-Chou Lin, New Taipei (TW); Zheng-Ping He, New Taipei (TW)

(73) Assignee: Sunasic Technologies, Inc., New Taipei City (TW)

( * ) Notice: Subject to any disclaimer, the term of this patent is extended or adjusted under 35 U.S.C. 154(b) by 769 days.

(21) Appl. No.: 14/543,936

(22) Filed: Nov. 18, 2014

(65) Prior Publication Data

US 2016/0141235 A1    May 19, 2016

(51) Int. Cl.
| | |
|---|---|
| G06K 9/00 | (2006.01) |
| H01L 23/13 | (2006.01) |
| H05K 3/46 | (2006.01) |
| H01L 23/14 | (2006.01) |
| H05K 1/18 | (2006.01) |
| H01L 23/498 | (2006.01) |
| H05K 3/32 | (2006.01) |

(52) U.S. Cl.
CPC ............ *G06K 9/0002* (2013.01); *H01L 23/13* (2013.01); *H01L 23/142* (2013.01); *H05K 1/184* (2013.01); *H05K 3/4644* (2013.01); *H01L 23/49822* (2013.01); *H01L 2224/45144* (2013.01); *H01L 2224/48091* (2013.01); *H01L 2924/0002* (2013.01); *H05K 3/321* (2013.01); *H05K 2201/10151* (2013.01)

(58) Field of Classification Search
CPC ..... H01L 23/13; H01L 23/142; H01L 23/145; H06K 9/00013; H06K 9/0002; G06K 9/00013; G06K 9/0002
See application file for complete search history.

(56) References Cited

U.S. PATENT DOCUMENTS

| | | | |
|---|---|---|---|
| 6,661,084 B1 * | 12/2003 | Peterson | ............... H01L 25/105 257/680 |
| 6,825,551 B1 * | 11/2004 | Do Bento Vieira | ......................... H01L 23/3107 257/678 |
| 7,851,246 B2 * | 12/2010 | Camacho | ............ H01L 21/6835 257/433 |
| 2013/0221452 A1 * | 8/2013 | Strothmann | ............ H01L 24/19 257/414 |

* cited by examiner

*Primary Examiner* — Mark Tornow
*Assistant Examiner* — Abbigale Boyle
(74) *Attorney, Agent, or Firm* — Che-Yang Chen; Law Offices of Scott Warmuth

(57) ABSTRACT

A printed circuit board assembly (PCBA) and a method to assemble the PCBA are disclosed. The PCBA includes a printed circuit board (PCB), an image sensing chip and a protection layer. The PCB includes a first insulation layer, a second insulation layer, a first electrically conductive layer, a second electrically conductive layer, and a third electrically conductive layer. The image sensing chip has a number of bonding pads with a sensor portion facing down through the second opening. The PCBA can function as an image sensing module and make the module have the thinnest thickness.

12 Claims, 11 Drawing Sheets

PRINTED CIRCUIT BOARD ASSEMBLY WITH IMAGE SENSOR MOUNTED THEREON

FIELD OF THE INVENTION

The present invention relates to a printed circuit board assembly. More particularly, the present invention relates to a printed circuit board assembly with an image sensor mounted thereon.

BACKGROUND OF THE INVENTION

A silicon chip, or integrated circuit (IC), is the core element of an electronic device and usually comes in packaged form. With the development of manufacturing technology and requirement of compact design for end products, various packaging methods were invented to meet the demand. At most of the time, silicon chips are sealed within a protection material such as epoxy resin. There are certain cases, particularly when the silicon chip is a sensor device such as a fingerprint sensor chip, that the silicon chip needs to be mount on a substrate and has the surface exposed. Meanwhile, for a fingerprint reader device, the thickness of the packaged sensor must be as low as possible. Hence, the technique of bonding the silicon chip to the substrate plays a very important role. The bonding needs to ensure good circuit connectivity formed therebetween, and to be rigid enough to sustain the fingerprint reader sensor with shear force exerted by a finger.

Conventional wire bonding is applicable to the above requirement. Please refer to FIG. 1. A PCB 1 has an opening 2. A chip 3 in form of a die would like to be mounted on the PCB 1, over the opening 2. There are many attachment pads 4 on one surface of the chip 3. Some connectors 5 are arranged on the PCB 1. By wire bonding, gold wires 6 are formed to link the related attachment pads 4 and the connectors 5. In order to fix the PCB 1 and the chip 3, a layer of glue (not shown) may be applied on the interface between the PCB 1 and the chip 3. For some electronic devices, thickness is much concerned. Wire bonding for the PCB 1 and the chip 3 is not proper for them. This is because the height H of the gold wires 6 over the PCB 1 will occupy more space above the PCB 1 and make the thickness of the electronic device thicker.

Flip chip technology is another commonly used means to implement the above requirement. Take the same elements used in FIG. 1 for illustration. Please see FIG. 2. It should be noticed that near the end of the manufacturing process, the attachment pads 4 of the chip 3 are metalized to make them more receptive to solders. This typically consists of several treatments. Small dots of solder balls 7 are then deposited on each metalized pad 4. The chips 3 are then cut out of the wafer as normal. To attach the flipped chips 3 into the PCB 1, the chip 3 is inverted to bring the solder balls 7 down onto the connectors 5 on the underlying PCB 1. The solder balls 7 are then re-melted to produce an electrical connection, typically using a thermosonic bonding or alternatively a reflow solder process. This also leaves a small space between the chip's circuitry and the underlying mounting.

One challenge of the flip chip technology is heat dissipation for thermal stress in the chip 3. An adhesive (not shown) may be used as a heat bridge to ensure the solder balls 7 are not stressed due to differential heating of the chip 3 and the PCB 1. The adhesive distributes the thermal expansion mismatch between the chip 3 and the PCB 1, preventing stress concentration in the solder balls 7 which would lead to premature failure. When fan-outs of logic gates of a chip increases and associated pads for soldering become more and tiny, efficiency of heating dissipation of such adhesive for the solder balls get worse. Meanwhile, if the chip 3 is a fingerprint reader sensor chip, the binding ability between the chip and the PCB may not sufficient to resist the force exerted by a finger.

Therefore, an improved PCBA structure with a chip, especially an image sensor chip, mounted on a PCB over an opening is still desired. More particularly, the binding ability between the chip and the PCB should resist external force exerted onto the chip.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a printed circuit board assembly (PCBA) is disclosed. The PCBA includes: a printed circuit board (PCB), comprising: a first insulation layer having a first opening formed therein; a second insulation layer having a second opening formed therein; a first electrically conductive layer, formed a specific circuit on partial of a top surface of the first insulation layer; a second electrically conductive layer, formed another specific circuit and a plurality of connectors between the first insulation layer and the second insulation layer; and a third electrically conductive layer, formed still another specific circuit on partial of a bottom surface of the second insulation layer, and an image sensing chip, having a plurality of bonding pads with a sensor portion facing down through the second opening, and fixed on the platform with each bonding pad connected to one corresponding connector.

The second opening is smaller than the first opening and formed beneath the first opening. A platform is formed on a top surface of the second insulation layer enclosed by peripherals of the first opening. The plurality of connectors are formed on the platform.

According to the present invention, the bonding pad and the corresponding connector are connected by a conductive adhesive. The conductive adhesive is silver paste. Gaps between sidewalls of the first insulation layer and peripherals of the image sensing chip are filled by a non-conductive adhesive. The non-conductive adhesive is epoxy resin.

The PCBA further has a protection layer formed over some portions of the top surface of the first insulation layer, the first electrically conductive layer and a surface of the image sensing chip opposite to the sensor portion for providing resistance when a force is exerted on the sensor portion. The protection layer is formed by a non-conductive adhesive. The non-conductive adhesive is epoxy resin. The non-conductive adhesive is further applied along peripherals of the sensor portion and adjacent portions of the second electrically conductive layer and/or the second insulation layer. The conductive adhesive is printed on the top of each bonding pad, respectively, before connecting to the corresponding connector. The image sensing chip may be a fingerprint reader sensor chip.

The size of the sensor portion is substantially the same as or slightly smaller than that of the second opening, and the shape of the first opening is the similar to that of the image sensing chip but large enough in size so that the image sensing chip can be allocated in the first opening.

Preferably, a step gap between a level of the surface opposite to the sensor portion and the first insulation layer and/or the first electrically conductive layer after the image sensing chip is fixed on the platform is less than 0.1 mm.

In accordance with another aspect of the present invention, a method for assembling the PCBA mention above includes the steps of: applying the conductive adhesive on the bounding pads; placing the image sensing chip through the first opening with the sensor portion facing down, connectors electrically connected to and linked by the conductive adhesive, and sensor portion exposed by the second opening; filling the gaps with a non-conductive adhesive; and forming a protection layer over the top surface of the first insulation layer and a surface opposite to the sensor portion for providing resistance when a force is exerted on the sensor portion.

DETAILED DESCRIPTION OF THE PREFERRED EMBODIMENT

The present invention will now be described more specifically with reference to the following embodiment.

Figure 1:
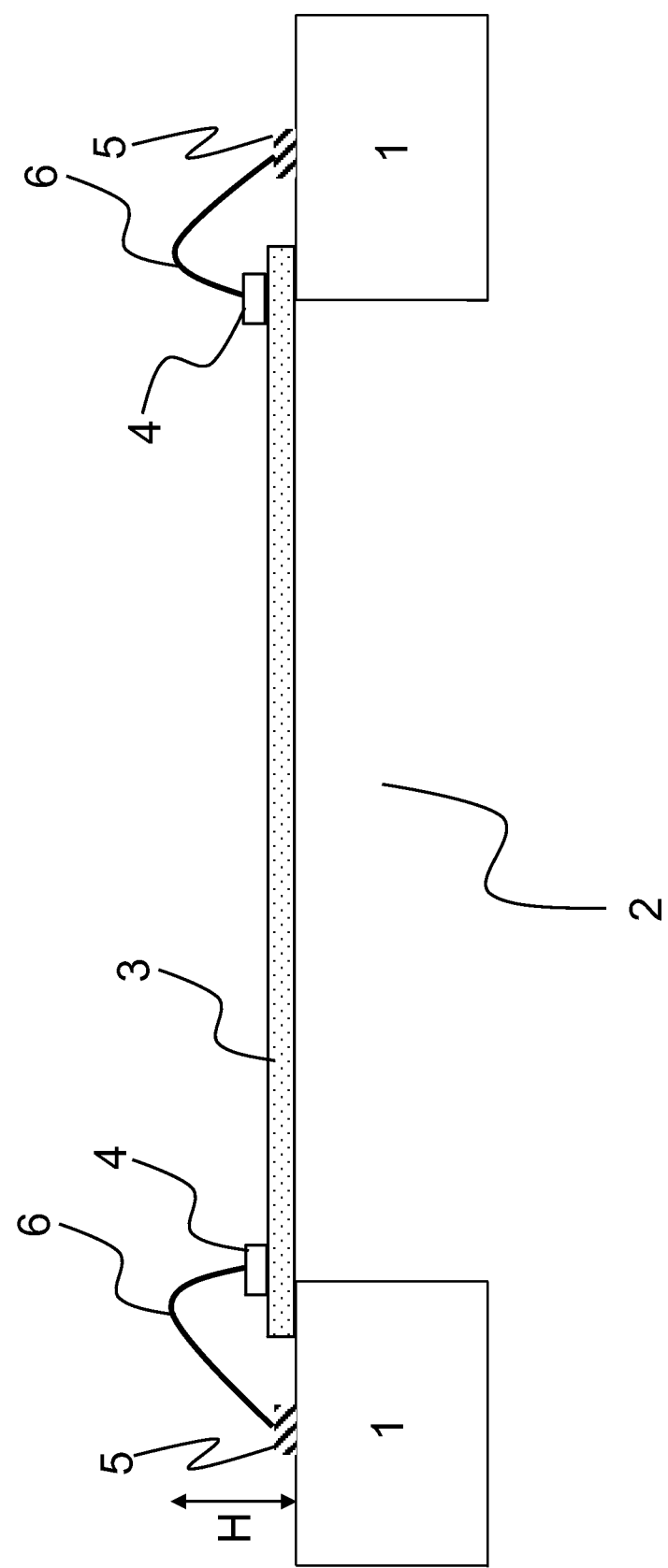
FIG. 1 is used to illustrate a conventional wire bonding process.
Figure 2:
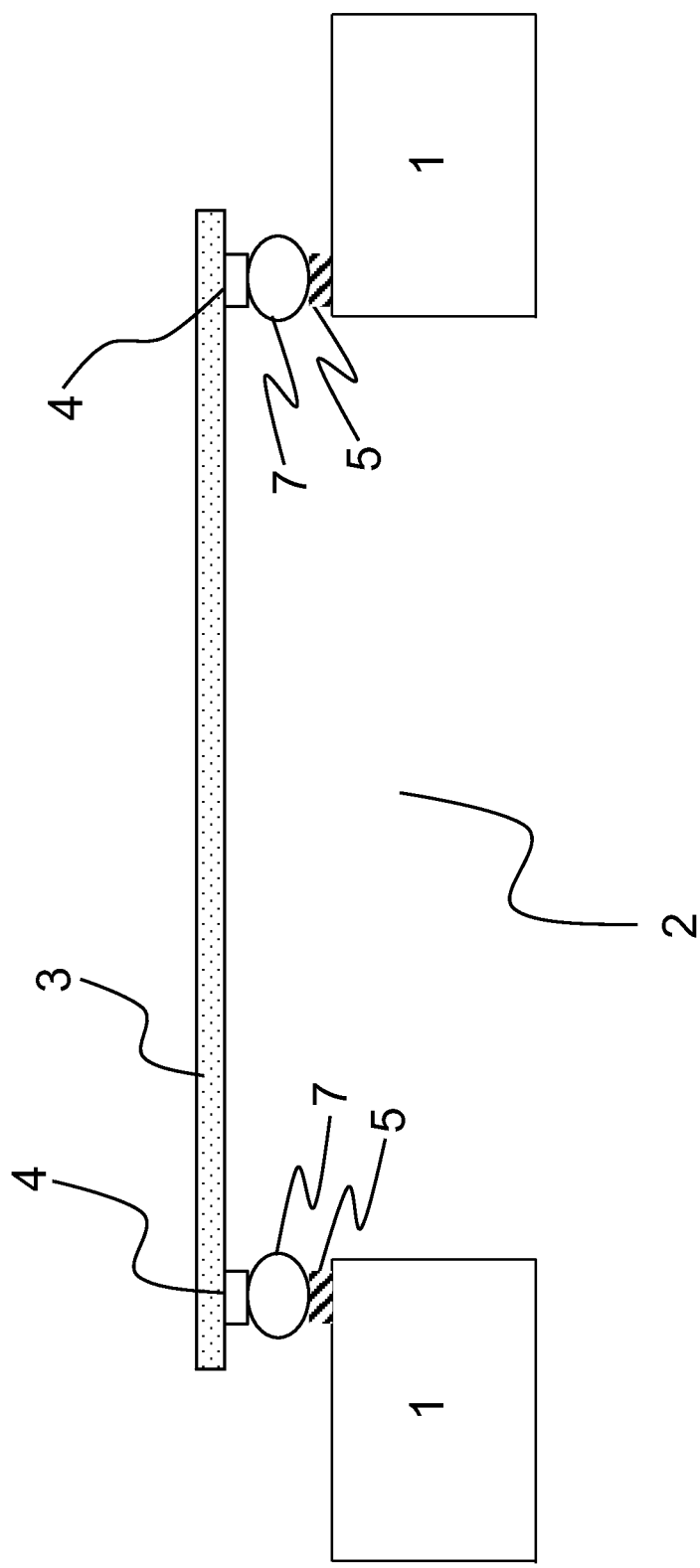
FIG. 2 is used to illustrate a conventional flip chip technology process.
Figure 3:
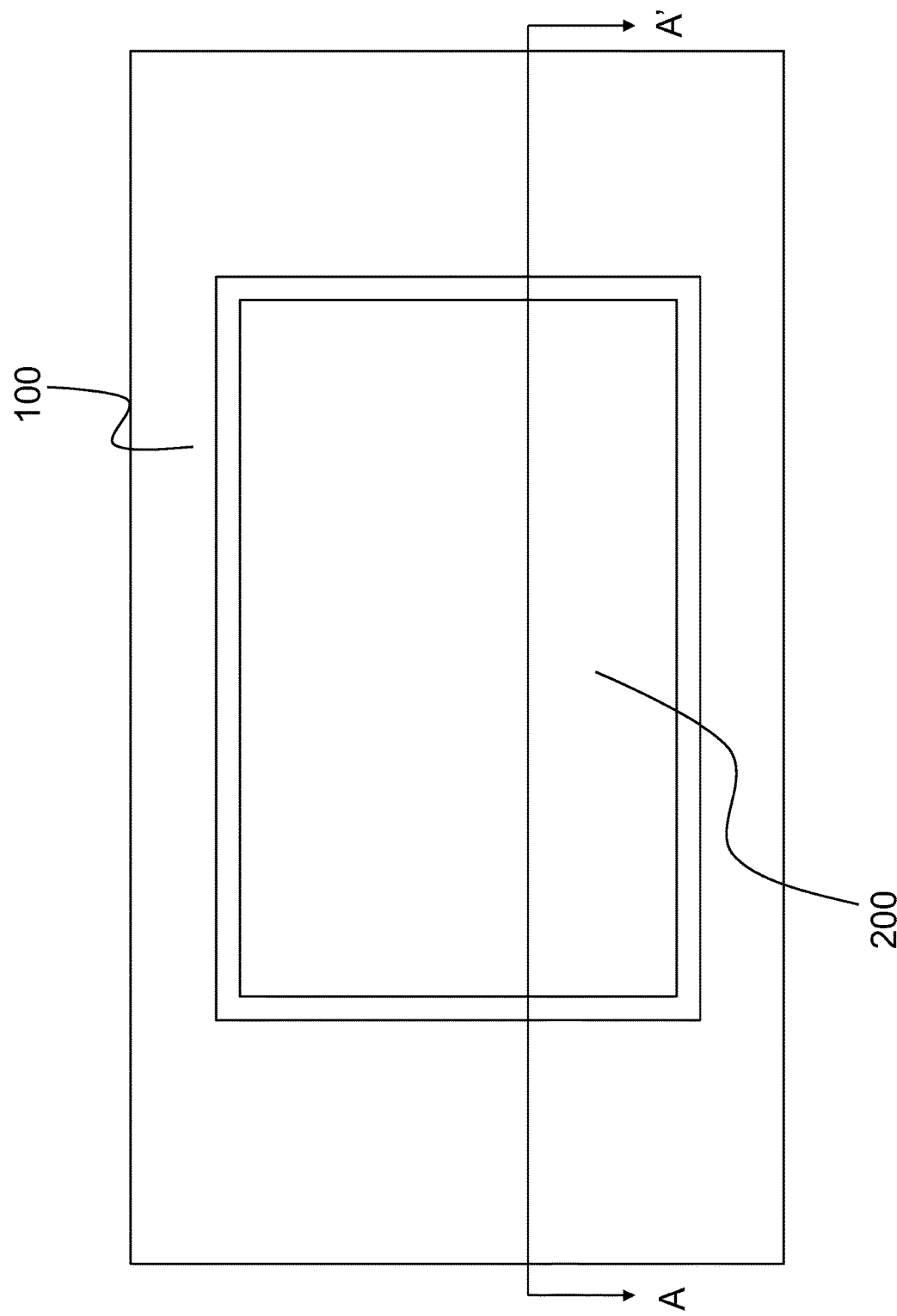
FIG. 3 is a top view of a printed circuit board assembly including an image sensing chip according to the present invention.

Please refer to FIG. 3 to FIG. 11. An embodiment is illustrated. FIG. 3 is a top view of a printed circuit board assembly (PCBA). The PCBA includes a printed circuit board (PCB) 100 and an image sensing chip 200. There are many image sensing chips can be used. In this embodiment, the image sensing chip 200 is a fingerprint reader. Please notice the sketches in the drawings may not be made according to the proportion. They are used for illustration only. The image sensing chip 200 may occupy less space than the PCB 100 in the PCBA. It should be noticed that in FIG. 3, a cross-sectional line AA' is marked. For a better understanding, the cross section cut by line AA' is used in following drawings.

Figure 4:
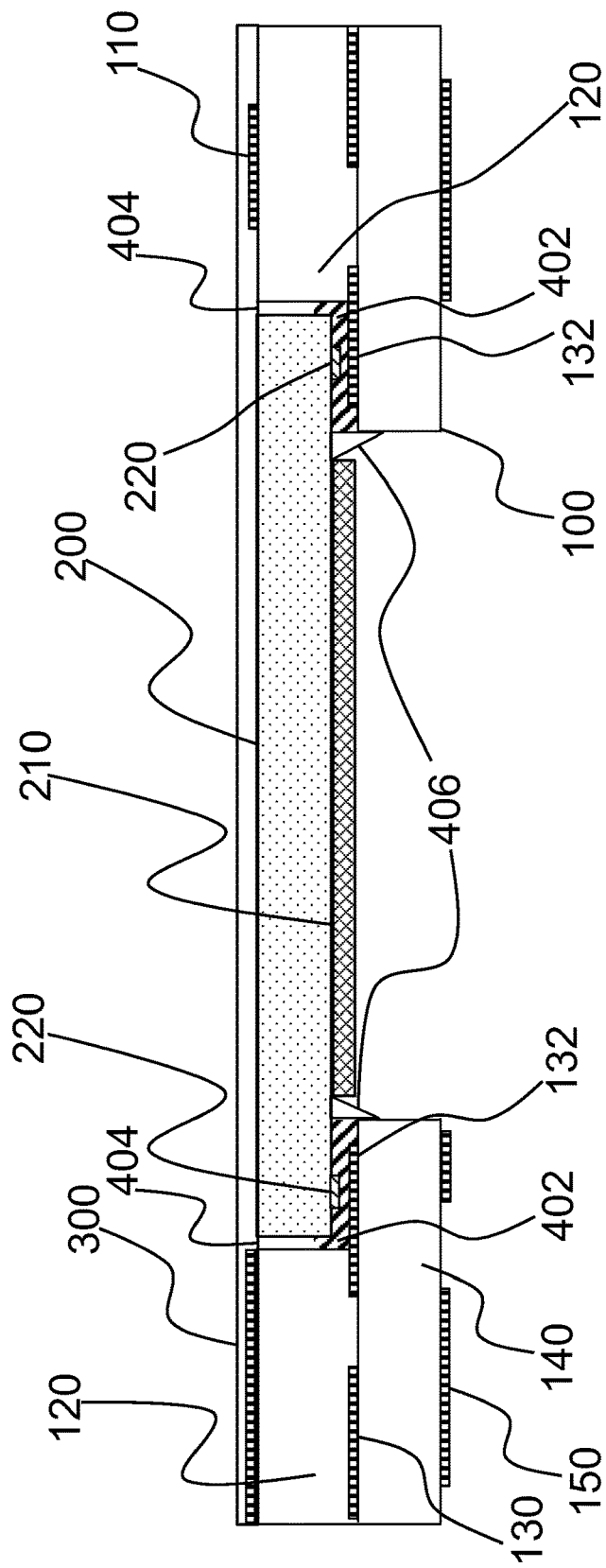
FIG. 4 is a cross-sectional view of the printed circuit board assembly.

Since the PCBA works as a fingerprint reader module, the PCB 100 has several key parts. Please see FIG. 4. They are a first electrically conductive layer 110, a first insulation layer 120, a second electrically conductive layer 130, a second insulation layer 140 and a third electrically conductive layer 150 listed in sequence from top to bottom in FIG. 4. The first electrically conductive layer 110 forms a specific circuit on partial of a top surface of the first insulation layer 120. As one can see, the first electrically conductive layer 110 shown in FIG. 4 is in form of discontinuous conductors. The conductors are made of copper or other metals or alloys. Although the conductors are not connected to each in the cross section, they are linked to form the circuit when the first electrically conductive layer 110 is taken out from the PCB 100. Layout is a common technique, it is not described here. It should be noticed that the second electrically conductive layer 130 and the third electrically conductive layer 150 are illustrated in the same way.

The first insulation layer 120 is used to separate the first electrically conductive layer 110 and the second electrically conductive layer 130. Meanwhile, the first insulation layer 120 also provides enough hardness to the PCB 100, preventing from breaking off. The first insulation layer 120 has a first opening 122 (please refer to FIG. 5) formed therein. The second electrically conductive layer 130 forms another specific circuit and a number of connectors 132 between the first insulation layer 120 and the second insulation layer 140. The connectors 132 are used to electrically connect to the bonding pads in the image sensing chip 200. If we take out the first electrically conductive layer 110 from the PCB 100, a top view will look like FIG. 5. The connectors 132 are extended and formed on a platform 143. The platform 143 is formed on a top surface of the second insulation layer 140 enclosed by peripherals of the first opening 122.

Figure 5:
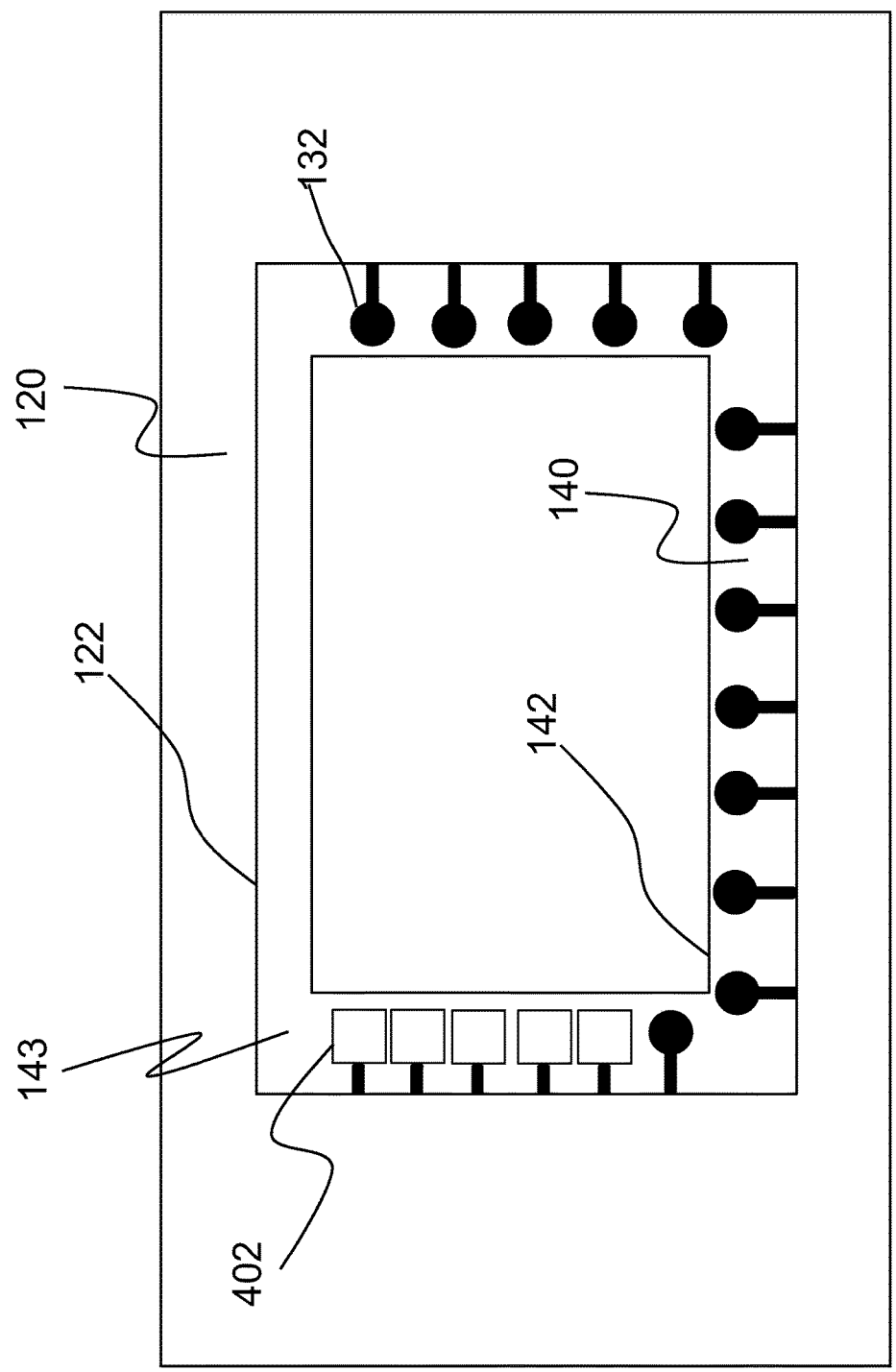
FIG. 5 is a top view of a first insulation layer and a second electrically conductive layer with connectors.
Figure 6:
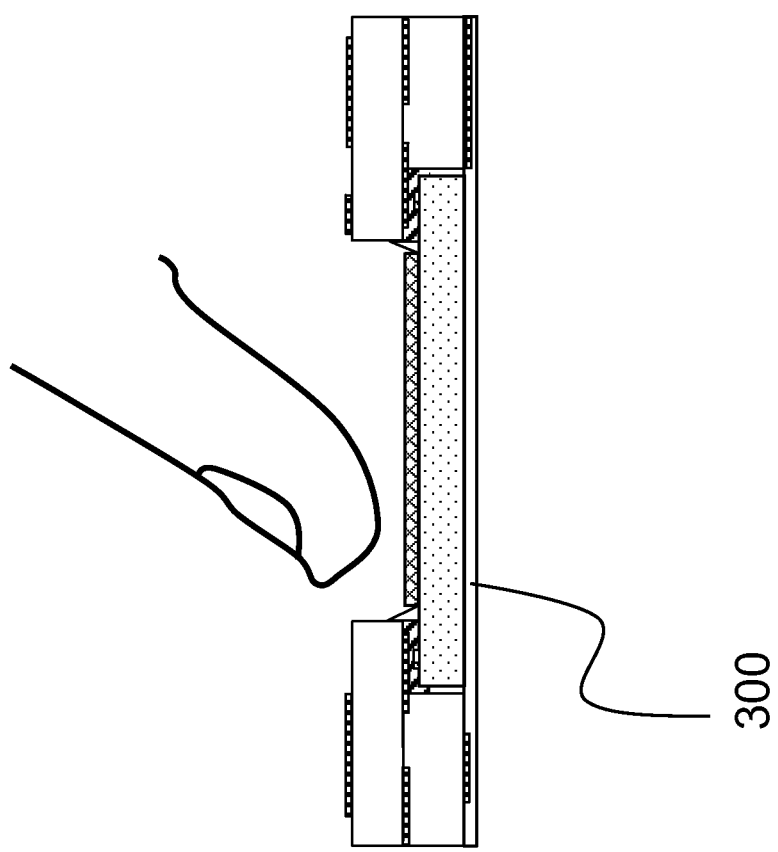
FIG. 6 shows how the printed circuit board assembly is applied.

The second insulation layer 140 basically has the same functions as the first insulation layer 120. It has a second opening 142 formed therein. However, as shown in FIG. 5, the second opening 142 is smaller than the first opening 122 and formed beneath the first opening 122. The third electrically conductive layer 150 forms still another specific circuit on partial of a bottom surface of the second insulation layer 140.

The image sensing chip 200 has a number of bonding pads 220. The image sensing chip 200 also has a sensor portion 210 facing down through the second opening 142. It is fixed on the platform 143 with each bonding pad 220 connected to one corresponding connector 132.

The PCBA further includes a protection layer 300. Please see FIG. 5 again. The protection layer 300 forms over some portions of the top surface of the first insulation layer 120, the first electrically conductive layer 110 and a surface of the image sensing chip 200 opposite to the sensor portion 210. It should be emphasized that the fingerprint reader module (the PCBA functions) is upside down when it is used. Please see FIG. 6. A finger is scanned for its fingerprint in the second opening 142. The protection layer 300 can provide resistance when a force is exerted on the sensor portion 210. The protection layer is formed by a non-conductive adhesive. Preferably, the non-conductive adhesive is epoxy resin. It can be also made by organic coating material. In addition, the non-conductive adhesive can be further applied along peripherals of the sensor portion 210 and adjacent portions of the second electrically conductive layer 130 and/or the second insulation layer 140 as a fixture 406. The fixture 406 can provide tension when the finger exerts force on the sensor portion 210.

For linkage of some components mentioned, there many suitable ways. For example, the bonding pad 220 and the corresponding connector 132 are connected by a conductive adhesive 402. Preferable, silver paste is used as the conductive adhesive 402 for its conductivity and adhesive. The conductive adhesive is printed on the top of each bonding pad 220, respectively, before they are connected to the corresponding connector 132. Besides, gaps between sidewalls of the first insulation layer 120 and peripherals of the image sensing chip 200 are filled by a non-conductive adhesive 404. Epoxy resin is a good choice for the non-conductive adhesive 404. The non-conductive adhesive 404 can assist to fix the image sensing chip 200 into first opening 122 while no more current leakage may occur.

According to the present invention, the size of the sensor portion 210 should be substantially the same as or slightly smaller than that of the second opening 142. Thus, width of the fixture 406 depends on the gaps between the sensor portion 210 and the second opening 142 as shown in FIG. 4. Or the fixture 406 may cover portions of the peripheral of the sensor portion 210. Meanwhile, the shape of the first opening 122 is similar to that of the image sensing chip but large enough in size so that the image sensing chip 200 can be allocated in the first opening 122. This is to reduce the risk that the image sensing chip 200 may slide in the second opening 142 when the finger exerts its force. A step gap between a level of the surface opposite to the sensor portion 210 and the first insulation layer 120 and/or the first electrically conductive layer 110 after the image sensing chip 200 is fixed on the platform is less than 0.1 mm. Thus, the protection layer 300 can be attached well without any being torn off due to a large step gap.

Figure 7:
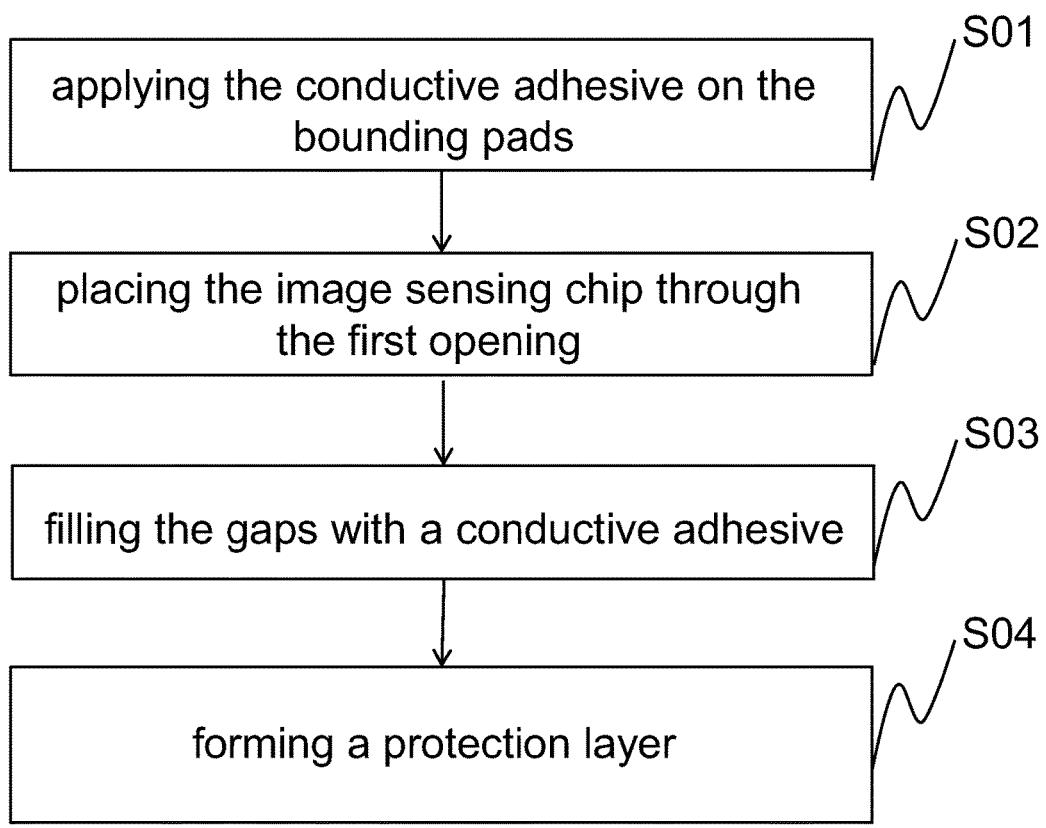
FIG. 7 is a flow chart of a procedure for assembling the printed circuit board assembly according to the present invention.

The PCBA has a procedure to assemble the PCBA. Please refer to FIG. 7 to FIG. 11 at the same time. FIG. 7 is a flow chart of the procedure for assembling the PCBA according to the present invention. FIG. 8 to FIG. 11 are used to illustrate each step in the procedure.

Figure 8:
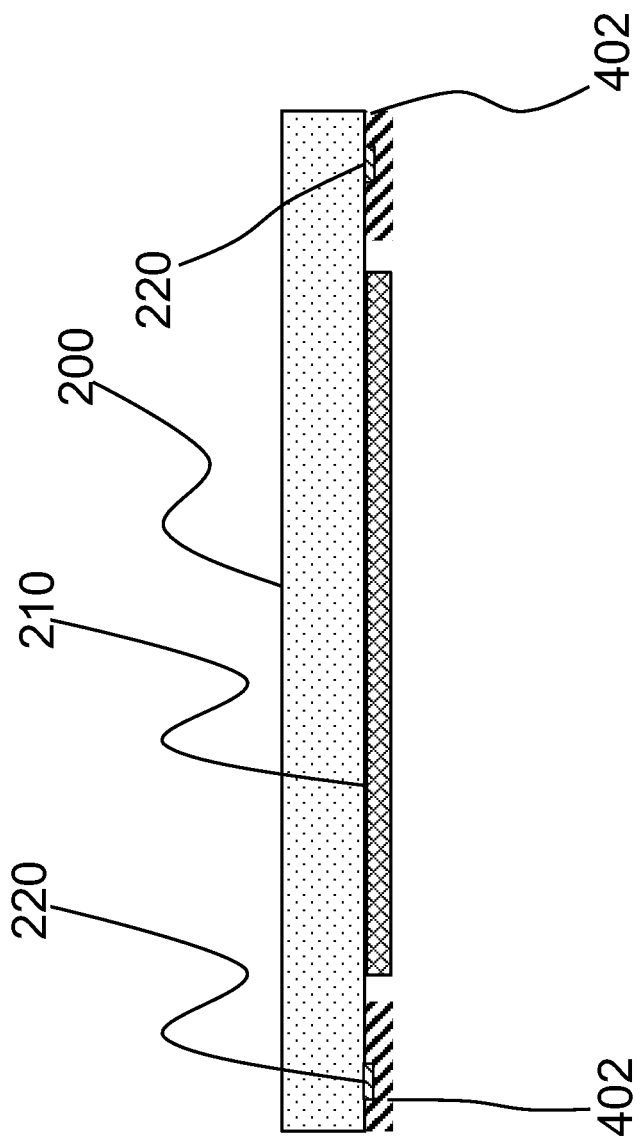
FIG. 8 to FIG. 11 are used to illustrate each step in the procedure.
Figure 9:
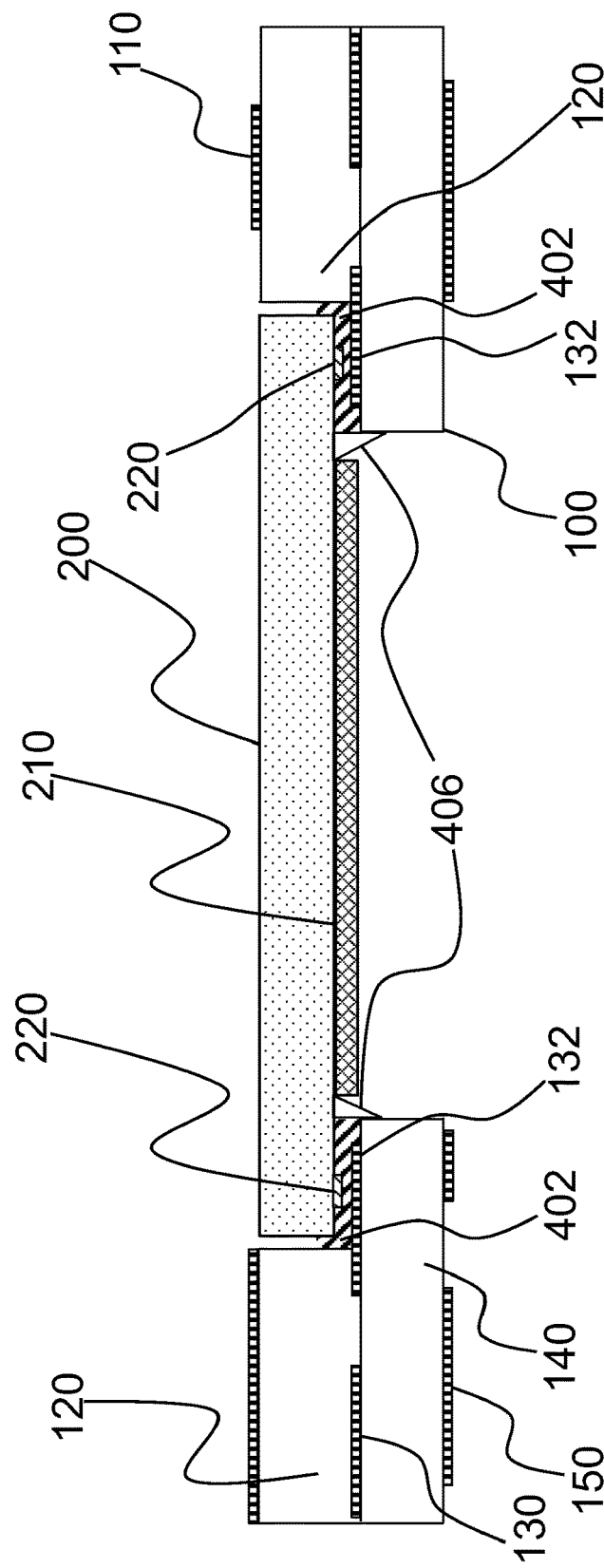
Figure 10:
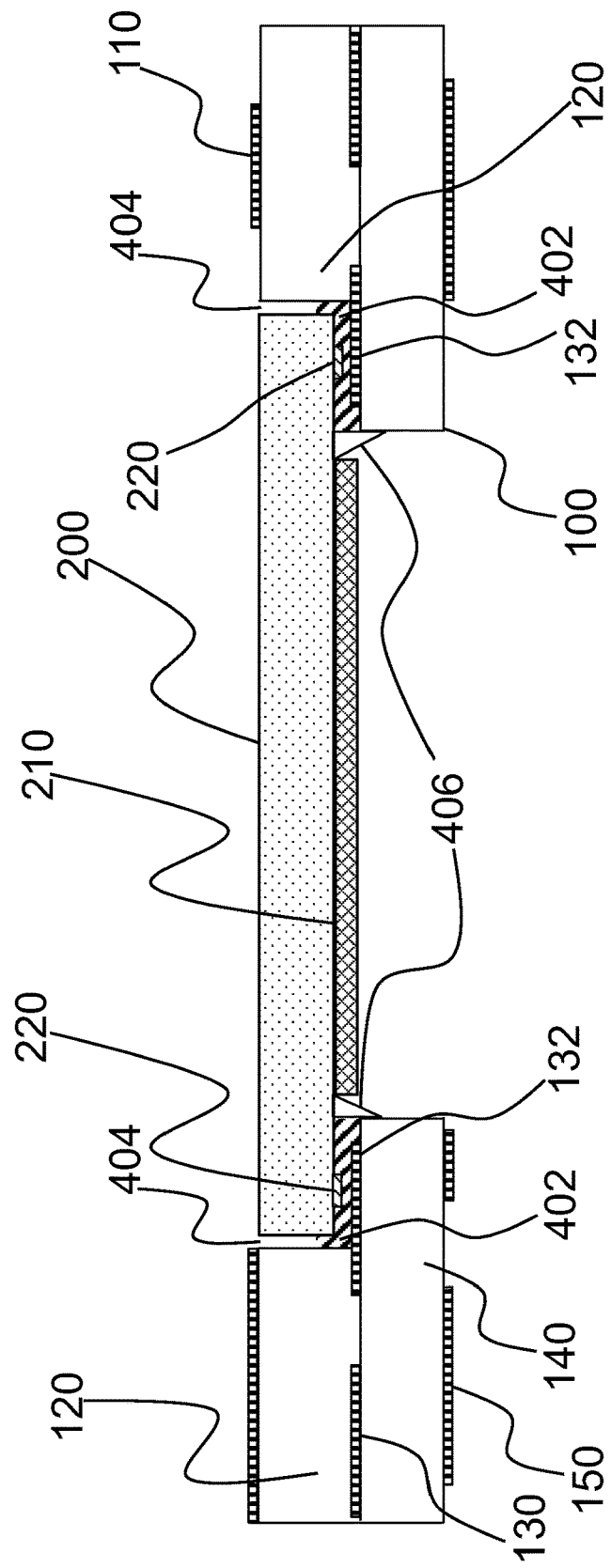
Figure 11:
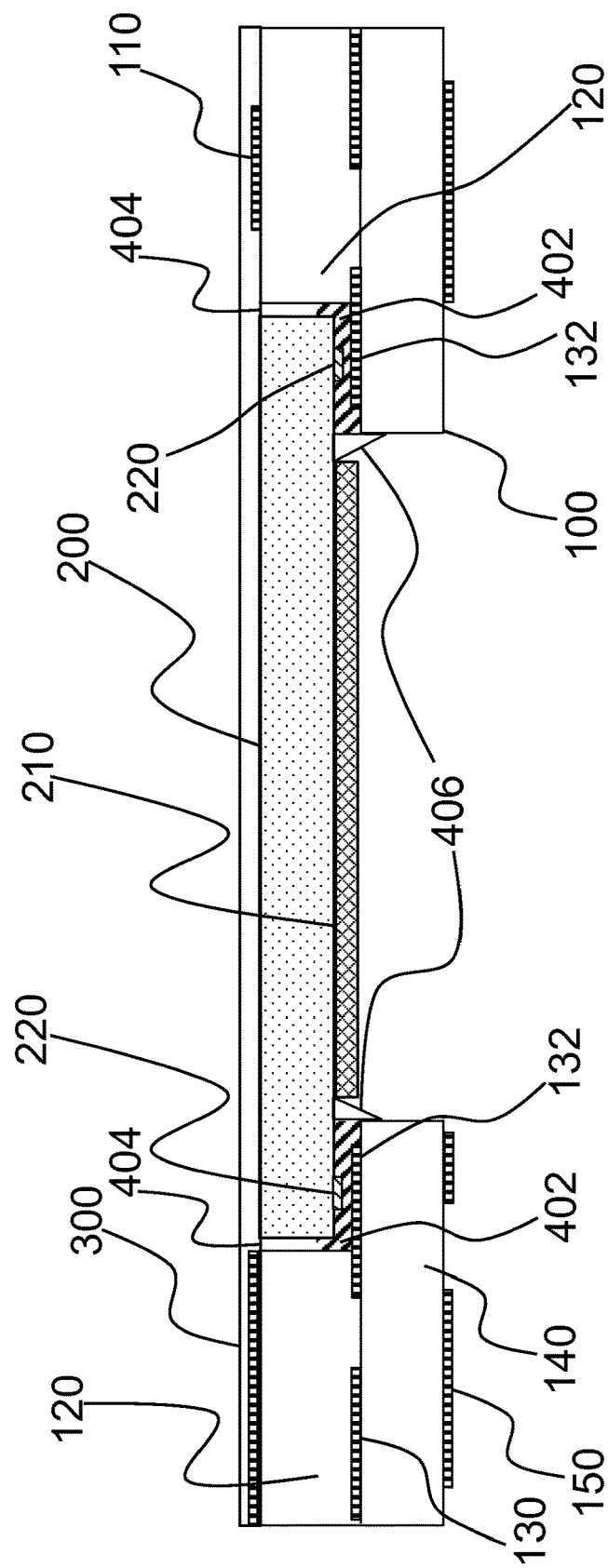

First, apply the conductive adhesive 402 on the bounding pads 220 (S01, FIG. 8). Then, place the image sensing chip 200 through the first opening 122 with the sensor portion 210 facing down, connectors 132 electrically connected to and linked by the conductive adhesive 402, and sensor portion 210 exposed by the second opening 142 (S02, FIG. 9). Next, fill the gaps with a non-conductive adhesive 404 (S03, FIG. 10). Finally, form the protection layer 300 over the top surface of the first insulation layer 120 and a surface opposite to the sensor portion 210 for providing resistance when a force is exerted on the sensor portion 210 (S04, FIG. 11).

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A printed circuit board assembly (PCBA), comprising:
   a printed circuit board (PCB), comprising:
   a first insulation layer, having a first opening formed therein;
   a second insulation layer, having a second opening formed therein;
   a first electrically conductive layer, forming a first specific circuit on a partial top surface of the first insulation layer;
   a second electrically conductive layer, forming a second specific circuit and a plurality of connectors between the first insulation layer and the second insulation layer; and
   a third electrically conductive layer, forming a third specific circuit on a partial bottom surface of the second insulation layer,
   wherein the second opening is smaller than the first opening and formed beneath the first opening; a platform is formed on a top surface of the second insulation layer enclosed by peripherals of the first opening; the plurality of connectors are formed on the platform;
   an image sensing chip, having a plurality of bonding pads with a sensor portion facing down through the second opening, and fixed on the platform with each bonding pad connected to one corresponding connector; and
   a protection layer formed over some portions of the top surface of the first insulation layer, the first electrically conductive layer and a whole bottom surface of the image sensing chip opposite to the sensor portion for providing resistance when a force is exerted on the sensor portion,
   wherein the first insulation layer and the whole bottom surface of the image sensing chip together form a flat surface for the protection layer to be formed thereon; and
   wherein a non-conductive adhesive is applied in gaps between the sensor portion and the second opening while the sensor portion has a size smaller than the second opening or applied along peripheral of the sensor portion while the sensor portion has a size the same as the second opening to form a fixture to provide tension when a finger exerts force on the sensor portion of the image sensing chip.

2. The PCBA according to claim 1, wherein the bonding pad and the corresponding connector are connected by a conductive adhesive.

3. The PCBA according to claim 2, wherein the conductive adhesive is silver paste.

4. The PCBA according to claim 1, wherein the non-conductive adhesive is further included in gaps between sidewalls of the first insulation layer and peripherals of the image sensing chip.

5. The PCBA according to claim 4, wherein the non-conductive adhesive is epoxy resin.

6. The PCBA according to claim 1, wherein the protection layer is formed by the non-conductive adhesive.

7. The PCBA according to claim 6, the non-conductive adhesive is further applied along peripherals of the sensor portion and adjacent portions of the second electrically conductive layer and/or the second insulation layer.

8. The PCBA according to claim 1, wherein the protection layer is made of organic coating material.

9. The PCBA according to claim 2, wherein the conductive adhesive is printed on the top of each bonding pad, respectively, before connecting to the corresponding connector.

10. The PCBA according to claim 1, wherein the image sensing chip is a fingerprint reader sensor chip.

11. The PCBA according to claim 1, wherein the size of the sensor portion is substantially the same as or slightly smaller than that of the second opening, and the shape of the first opening is the similar to that of the image sensing chip but large enough in size so that the image sensing chip can be allocated in the first opening.

12. The PCBA according to claim 1, wherein a step gap between a level of a surface opposite to the sensor portion and the first insulation layer and/or the first electrically conductive layer after the image sensing chip is fixed on the platform is less than 0.1 mm.

* * * * *